United States Patent
Ingalz et al.

(10) Patent No.: US 12,119,156 B2
(45) Date of Patent: Oct. 15, 2024

(54) INDUCTOR THERMAL MANAGEMENT SYSTEM

(71) Applicant: Lunar Energy, Inc., Mountain View, CA (US)

(72) Inventors: Charles Ingalz, San Jose, CA (US); Gargi Kailkhura, San Jose, CA (US); Mark Daniel Goldman, Los Altos Hills, CA (US); Bozhi Yang, Los Altos, CA (US); Christopher McCarthy, Salinas, CA (US); Peter H. J. How, Mililani, HI (US); Xu She, Cupertino, CA (US)

(73) Assignee: Lunar Energy, Inc., Mountain View, CA (US)

( * ) Notice: Subject to any disclaimer, the term of this patent is extended or adjusted under 35 U.S.C. 154(b) by 0 days.

(21) Appl. No.: 18/378,776

(22) Filed: Oct. 11, 2023

(65) Prior Publication Data

US 2024/0120143 A1 Apr. 11, 2024

Related U.S. Application Data

(60) Provisional application No. 63/415,150, filed on Oct. 11, 2022.

(51) Int. Cl.
  *H01F 27/02* (2006.01)
  *H01F 27/08* (2006.01)
  *H01F 41/00* (2006.01)
  *H05K 7/20* (2006.01)

(52) U.S. Cl.
  CPC ......... *H01F 27/085* (2013.01); *H01F 27/025* (2013.01); *H01F 41/005* (2013.01); *H05K 7/20418* (2013.01)

(58) Field of Classification Search
  CPC ..................................... H01F 27/085
  USPC .......................................... 336/90
  See application file for complete search history.

(56) References Cited

U.S. PATENT DOCUMENTS

| | | | |
|---|---|---|---|
| 6,392,519 B1 * | 5/2002 | Ronning | H01F 27/025 336/61 |
| 2009/0128276 A1 * | 5/2009 | Horowy | H01F 17/062 336/96 |
| 2012/0287582 A1 * | 11/2012 | Vinciarelli | B29C 45/14639 361/728 |
| 2018/0366257 A1 * | 12/2018 | Ovando | H01F 27/327 |
| 2020/0194160 A1 * | 6/2020 | Tsuchida | H01F 27/22 |
| 2021/0136948 A1 * | 5/2021 | Tanaka | H05K 1/0203 |
| 2021/0398732 A1 * | 12/2021 | Nayak | H01F 37/00 |

OTHER PUBLICATIONS

Author unknown, ULINE Corrugated Corner Protectors—4 x 4, downloaded from <https://web.archive.org/web/20150403034655/https://www.uline.com/Product/Detail/S-8473/Protectors/Corrugated-Corner-Protectors-4-x-4>, published Apr. 3, 2015.

* cited by examiner

*Primary Examiner* — Ronald Hinson
(74) *Attorney, Agent, or Firm* — Van Pelt, Yi & James LLP

(57) ABSTRACT

In various embodiments, an inductor thermal management system includes an inductor, and a heat sink. The heat sink includes a cavity and a spacer adapted to situate the inductor within the cavity and separate the inductor from at least one wall of the cavity such that heat is transferred from the inductor into the heat sink multi-directionally.

17 Claims, 11 Drawing Sheets

INDUCTOR THERMAL MANAGEMENT SYSTEM

CROSS REFERENCE TO OTHER APPLICATIONS

This application claims priority to U.S. Provisional Patent Application No. 63/415,150 entitled INDUCTOR THERMAL MANAGEMENT SYSTEM filed Oct. 11, 2022 which is incorporated herein by reference for all purposes.

BACKGROUND OF THE INVENTION

Electrical devices include components that generate considerable heat. However, too much heat could create safety concerns as well as degrade the performance of certain components within the electronic device. It would be desirable to manage the heat generated by certain electrical components within an electrical device while maintaining electrical insulation to prevent any unwanted current flow.

BRIEF DESCRIPTION OF THE DRAWINGS

Various embodiments of the invention are disclosed in the following detailed description and the accompanying drawings.

DETAILED DESCRIPTION

Figure 1:
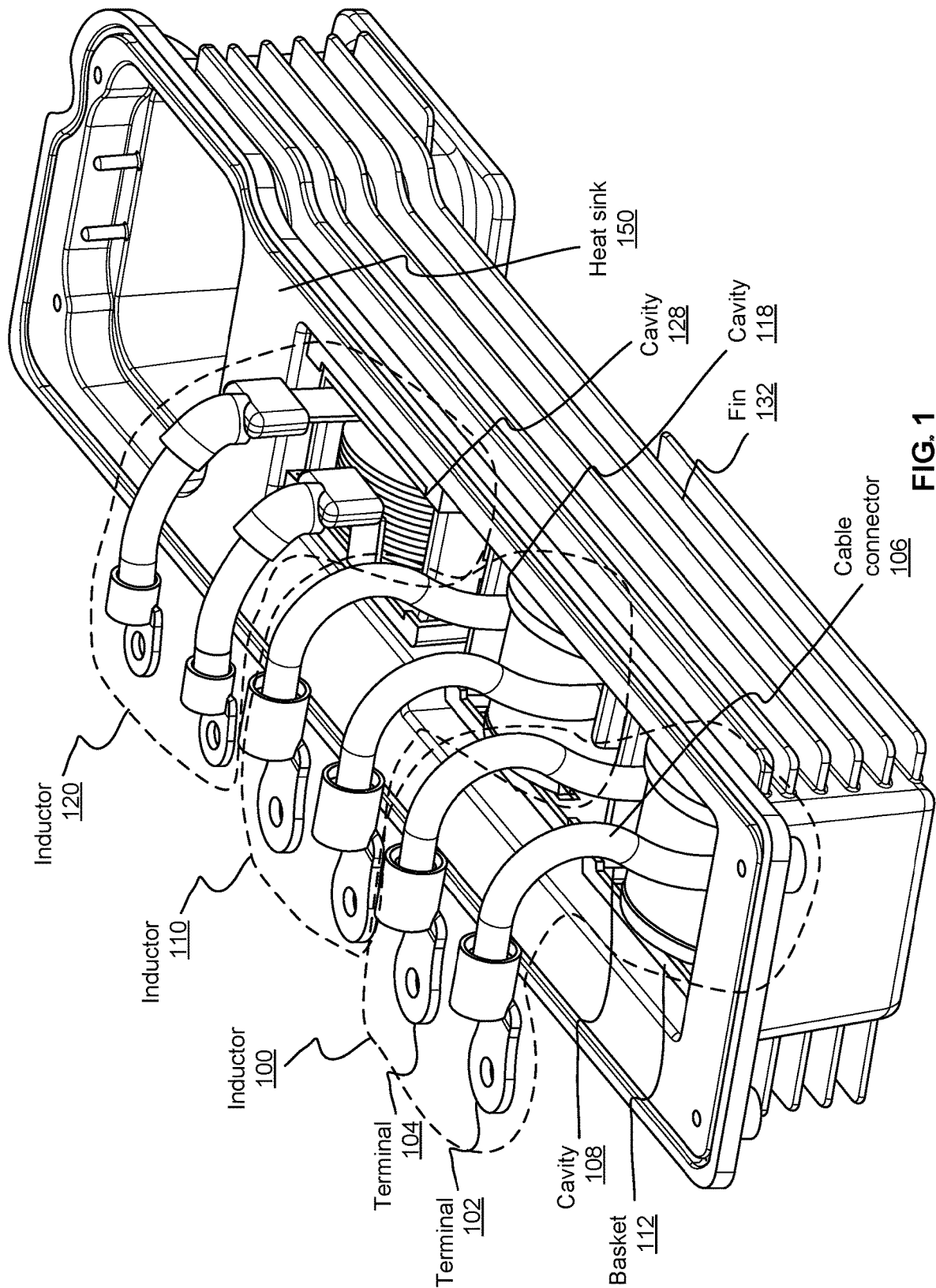
FIG. 1 is a perspective view of an inductor thermal management system according to an embodiment of the present disclosure.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Some conventional techniques attempt to the cool an inductor by placing the core of the inductor next to a heat sink with a thermal pad in between. However, experiments showed that this setup was insufficient and the inductor could not function as intended due to inadequate heat dissipation. For example, the coils generated heat as well and the core was not sufficiently conductive to dissipate heat to the heat sink.

By using potting material, heat dissipation is improved. The choice of the potting material can increase or decrease heat dissipation. For example, choosing a potting material that is more thermally conductive will increase heat dissipation. The potting material facilitates heat transfer from the inductor to the heat sink. Alternatively or in combination with the potting material, a basket may be used to position the inductor to avoid contacting the walls of the heat sink as further described herein.

Embodiments of an inductor thermal management system are described herein. The inductor thermal management system includes one or more inductors such as a primary switching inductor and/or a flat wire inductor. In some embodiments, the primary switching inductor (along with one or more other instances of inductors) is configured to perform the conversion of square waveforms (e.g., associated with direct current (DC)) to sinusoidal waveforms (e.g., associated with alternating current (AC)). The inductor thermal management system further includes a heat sink. The primary switching inductor is inset into the heat sink such that heat is transferred from the primary switching inductor into the heat sink multi-directionally.

FIG. 1 is a perspective view of an inductor thermal management system according to an embodiment of the present disclosure. The system includes one or more inductors 100, 110, and 120; and a heat sink 150. As further described with respect to FIGS. 4A and 4B, the inductor thermal management system may be included in an inverter device that is configured to convert DC (e.g., received from a source such as a battery or solar panels) into AC.

The inductor thermal management system may accommodate/include a variety of inductors, including a mixture of types of inductors within the same system. Here, inductors 100 and 110 are referred to as primary switching inductors and inductor 120 is referred to as a flat wire inductor.

In various embodiments, inductor 100 is configured to convert a square waveform of current into a sinusoidal waveform of current and dissipates heat in this process. A tradeoff in the selection of inductors is that an inductor of a smaller size produces more heat as compared to a larger inductor that provides a comparable amount of inductance. Given that inductor 100 is to be fit on a circuit board inside an inverter device in a space efficient manner, it may be desirable to limit the size of inductor 100. In some embodiments, given the selected size of inductor 100, while in operation, inductor 100 can produce between at least 12 to 15 watts of heat in operation. It is desirable to draw at least some of the heat that is generated by inductor 100 away into heat sink 150 so that the heat generated by inductor 100 does not raise the ambient temperature of the (e.g., power) module in which it is enclosed above a designated temperature.

In various embodiments, inductor 100 includes a core (e.g., a high flux core) and wire coiled around the core. The coil of inductor 100 uses Litz wire, which provides desirable electrical performance. Each inductor includes a pair of cable connectors 106 and terminals such as ring terminals. Example ring terminals 102 and 104 for inductor 100 are shown.

In various embodiments, inductor 110 has the same characteristics as inductor 100. Inductor 120 is a flat wire inductor, and produces around 6 watts of heat so its cooling requirements are lower than that of inductors 100 and 110.

The heat sink 150 includes a housing with one or more fins 132 and one or more cavities 108, 118, and 128. Each of the cavities is adapted to accept a basket. Only one of the baskets, 112, is labeled for simplicity of description. In this example, cavity 108 is adapted to receive inductor 100, an adjacent cavity 118 is adapted to hold inductor 110, and a third cavity 128 is adapted to hold inductor 120. Each of the inductors is adjacent to and separated from each other by a divider formed by a shared wall of the adjacent cavities.

As further described herein, the heat of inductor 100, along with that of one or more other inductors of the inverter device, is managed by placing inductor 100 into an inset portion (also referred to as a cavity 108) of heat sink 150 of an inverter device such that inductor 100 is surrounded by heat sink materials across multiple surfaces. In some embodiments, the heat of inductor 100 is further dissipated into heat sink 150 by fastening wiring from inductor 100 directly into heat sink 150.

The heat sink 150 can be made of a variety of materials. For example, any material with a thermal conductivity higher than a potting material (used to fill the cavities as further described herein) may be suitable. In various embodiments, the housing is made of (die-cast) aluminum, which has a thermal conductivity of K=80 to 90. Another material that could be used for the housing is (die-cast) zinc.

Figure 2A:
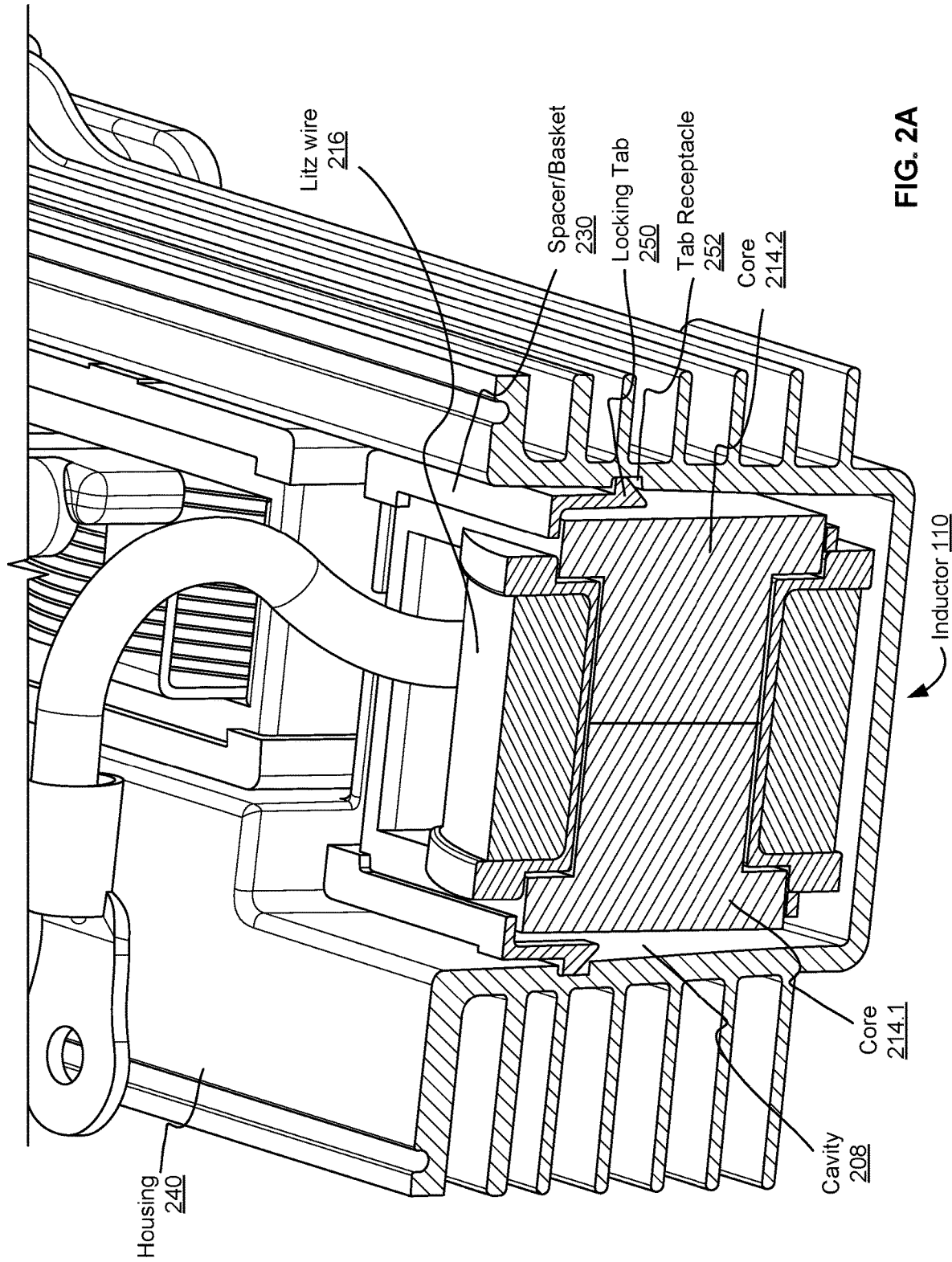
FIG. 2A is a perspective view of an inductor portion of an inductor thermal management system according to an embodiment of the present disclosure.

FIG. 2A is a perspective view of an inductor portion of an inductor thermal management system according to an embodiment of the present disclosure. Each of the components are like their counterparts in FIG. 1 unless otherwise described.

As shown in FIG. 2A, inductor 110 is placed into cavity 208 in a manner in which the cores of the inductors are not directly in contact with the inner walls of cavity 208 so as to maintain a desired degree of electrical insulation (also referred to as EMC or EMI protection). For example, the core of the inductor is separated from at least one wall of the cavity by a potting material, basket, spacer, or the like and/or a combination thereof. In some embodiments, inductor 110 and the adjacent inductors are assembled into an assembly before being placed into cavity 208. The assembly may include a basket 230. The basket may be non-conductive (e.g., plastic) and holds the inductor 110 in place to prevent the inductor from directly contacting the inner walls of the cavity. As further described herein, the basket 230 can be secured to housing 240 of the heat sink via a locking tab 250 that fits into a tab receptacle 252.

In this view, the details of a single inductor 110 are shown. The inductor includes a core with two halves (214.1 and 214.2). The inductor includes Litz wire 216 wrapped around a bobbin, which is provided inside of the core. The inductor is located within a basket 230. The basket separates the core from housing 240. There may be an electrical potential between this housing 240 and the core. To prevent EMI, potting material is provided to fill the spaces between the basket and the core to fully form an electrical barrier, as further described herein. In various embodiments, the core is a powdered metallic material.

Figure 2B:
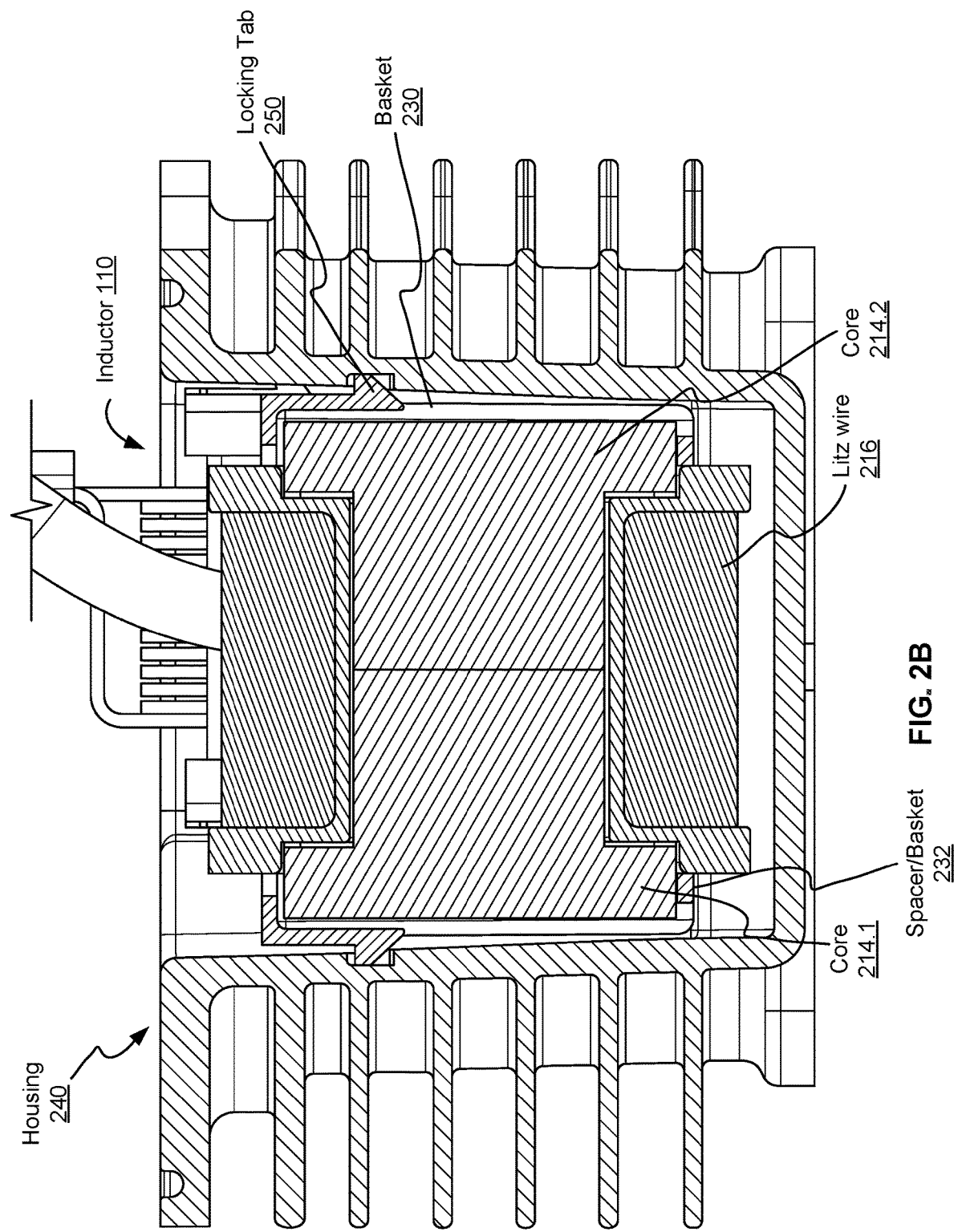
FIG. 2B is a side view of an inductor portion of an inductor thermal management system according to an embodiment of the present disclosure.

FIG. 2B is a side view of an inductor portion of an inductor thermal management system according to an embodiment of the present disclosure. In various embodiments, a spacer 232 is provided to ensure that the core is not closer than a certain distance to a wall of the cavity to provide a desired EMC. For example, the space may be on the order of fractions of a millimeter. The spacing may be provided by a spacer 232 or datum (e.g., 606 of FIG. 6), which is a frame of the basket in this example, as further described herein.

Figure 3:
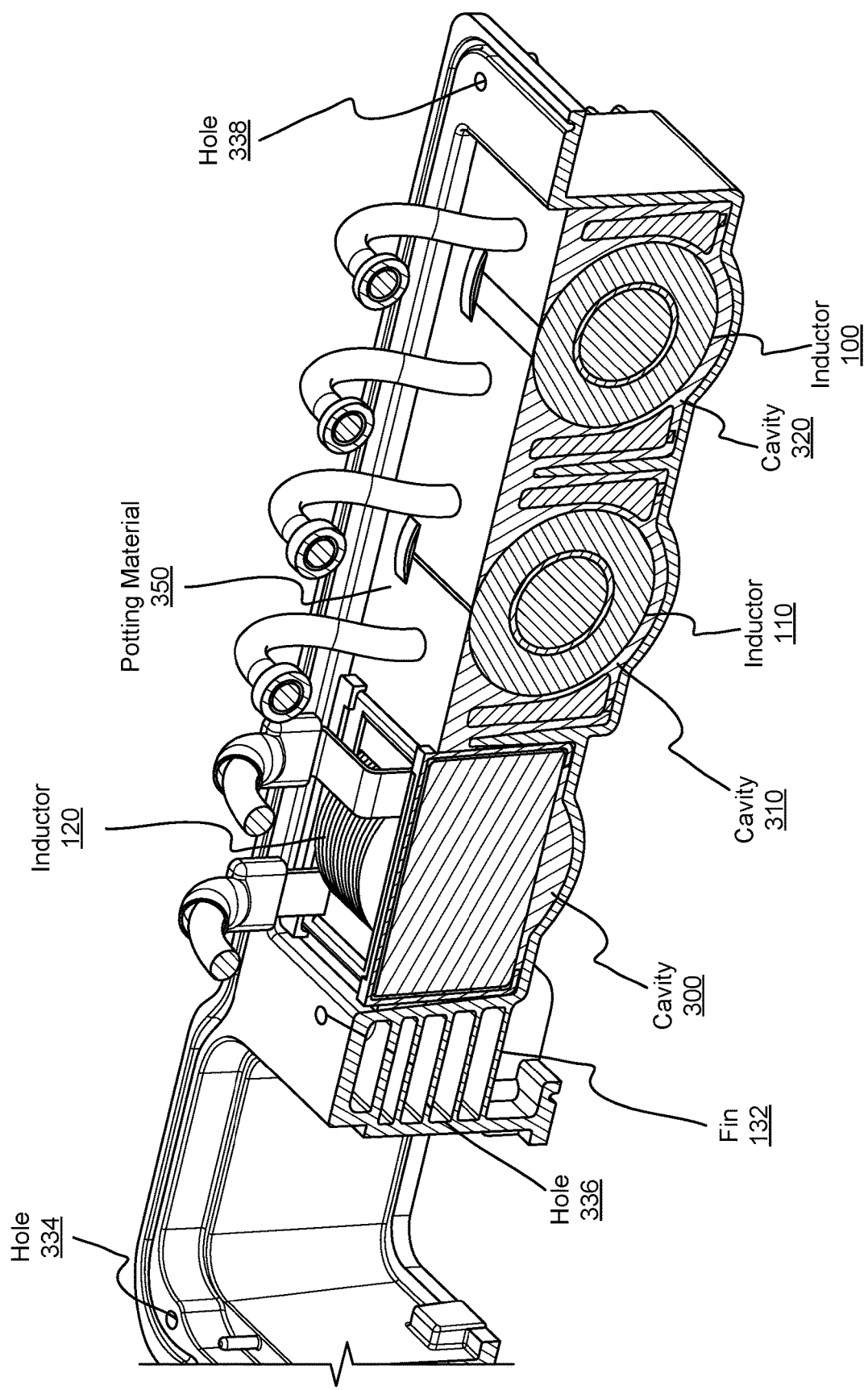
FIG. 3 is a cross-sectional view of an inductor thermal management system including a potting material according to an embodiment of the present disclosure.

FIG. 3 is a cross-sectional view of an inductor thermal management system including a potting material according to an embodiment of the present disclosure. Each of the components are like their counterparts in FIG. 1 unless otherwise described.

The module includes three cavities 300, 310, and 320. Each cavity holds a respective inductor. The type of cavity may be adapted for the type of inductor. For example, cavity 300 is sized for a flat wire inductor 120, while cavities 310 and 320 are sized for a primary switching inductor 100 and 110. The number and placement of cavities is merely exemplary and not intended to be limiting. For example, more cavities may be provided if there are more inductors in the module. Similarly, fewer cavities may be provided if there are fewer inductors in the module. Referring briefly to FIG. 4B, module 100 has three inductors while module 410 has two inductors.

Returning to FIG. 3, in this example, each of the inductors is immersed in potting material 350. The potting material 350 fills at least a portion of cavities 300, 310, and 320. The height may vary from cavity to cavity. Here, the priority for heat dissipation is cavity 310 and 320 where the primary switching inductors are because they generate more heat than the flat wire inductor 120 in cavity 300. More specifically, the core and coils of the primary switching inductor generate more heat compared with other components. Therefore, in various embodiments, the majority of the coils and cores is covered by the potting material to provide adequate cooling. In this example, the top of the flat wire inductor 120 is not covered by potting material, but this is sufficient because the flat wire inductor does not generate as much heat as the other inductors and therefore does not need as much cooling. A variety of materials may be used for the potting material. In various embodiments, any material with a thermal conductivity of K=4 or similar can be used. A different K value may be appropriate for a different environment. By choosing a potting material with a particular K value, heat dissipation for the (entire) inductor thermal management system can be modulated and optimized.

In various embodiments, the potting material functions as an electrical barrier to provide a desired EMC. Without the potting compound, clearances between components in the device are large. However, by using the potting material, components may be much closer. For example, an air gap (filled with potting material) is sufficient as an electrical barrier.

Figure 10:
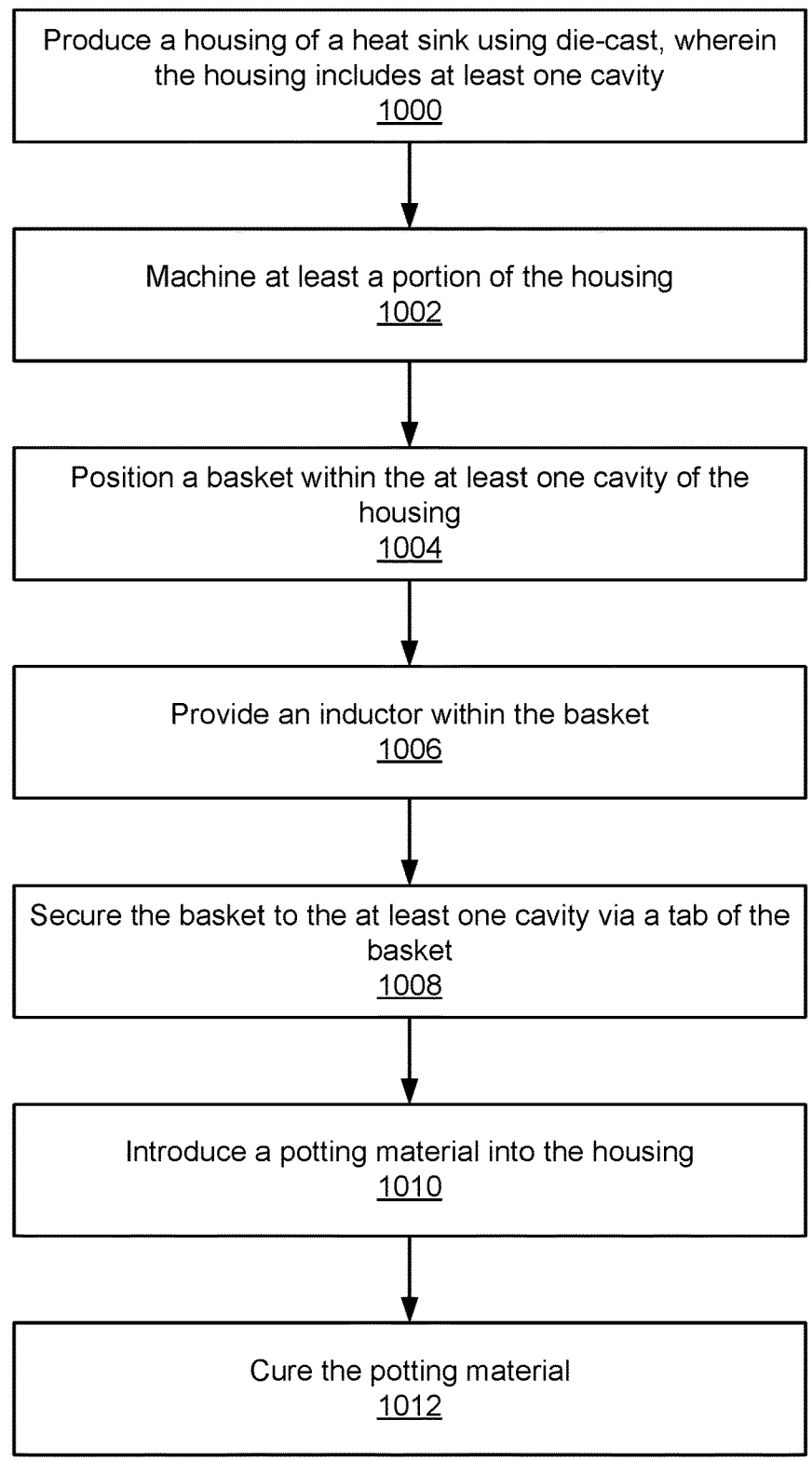
FIG. 10 is a flow diagram illustrating an embodiment of a process for manufacturing an inductor thermal management system.

As further described with respect to FIG. 10, after inductors such as inductors 100, 110, and 120 are inserted into cavities 300, 310, and 320, liquid potting material is poured into the cavities to cover the inductors and fill the air gaps between the inductors and the inner walls of the cavities. After the potting material is poured into the cavities, the assembly may be placed into a vacuum chamber to remove air bubbles within the potting material. Then, the assembly is placed in an oven to allow the potting material to cure. The potting material, which is thermally conductive and electrically insulating, will lower thermal impedance between the inductors and the housing and will therefore better enable heat to be transferred from each surface of each inductor that is adjacent to an inner wall of the cavity to the heat sink. In some embodiments, after the potting material is added to the inside of the housing, wiring (e.g., 106) of inductor 100 is bent and attached to terminal 102, which is attached to a screw that is directly fastened into the heat sink. As such, not only can heat be transferred from the surfaces of inductor 100 into the heat sink (via a respective cavity) via a potting material, heat can also be transferred from inductor 100 into the heat sink via wiring such as wiring 106.

One advantage of the assembly disclosed herein is that using a combination of the basket system and the potting material ensures that the inductor stays in place (even under extended periods of time in an inverted position). Conventional techniques that use potting material without a basket or other means of keeping the inductor in place may be susceptible to long-term creep as the potting material ages meaning the inductor may eventually fall out of place.

Figure 4A:
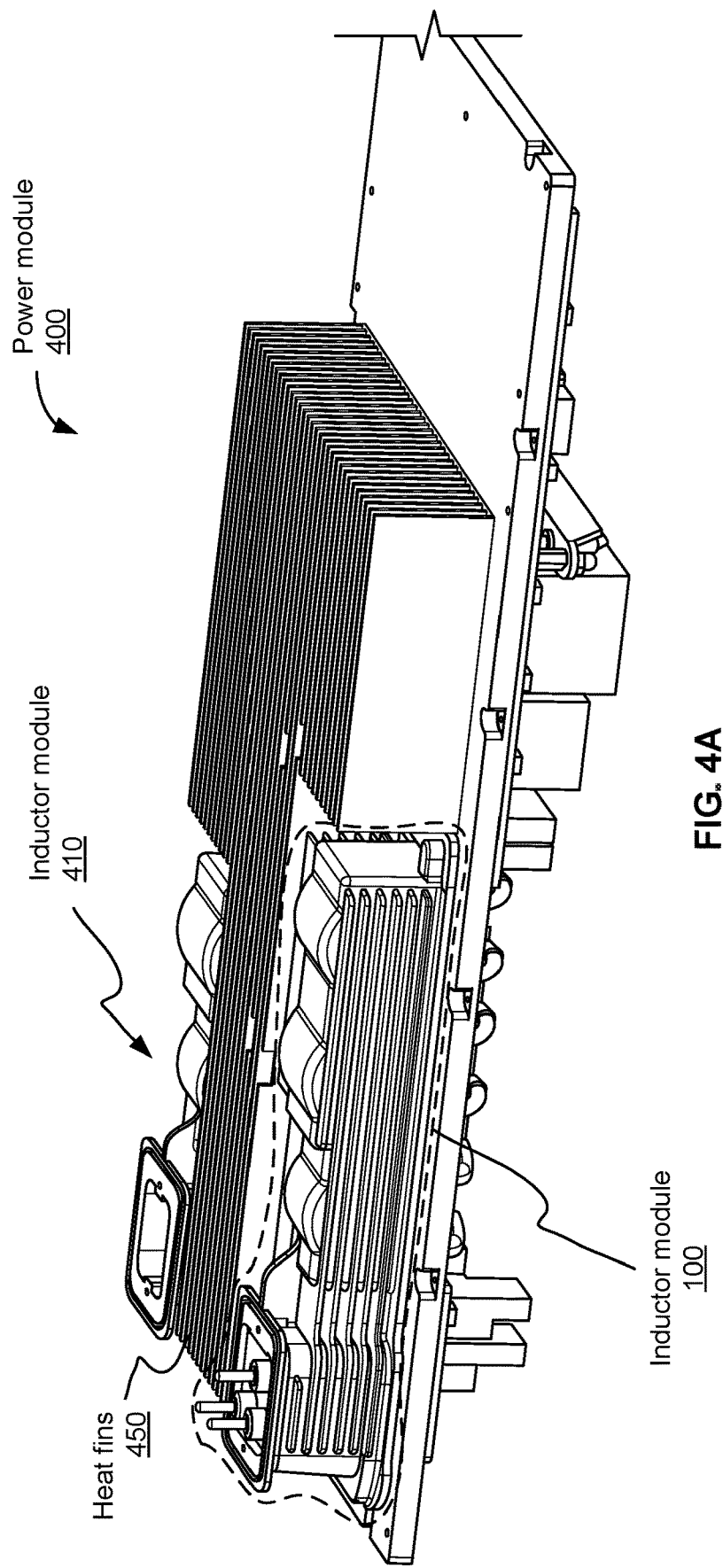
FIG. 4A is a perspective view of an inductor thermal management system within a power module according to an embodiment of the present disclosure.
Figure 4B:
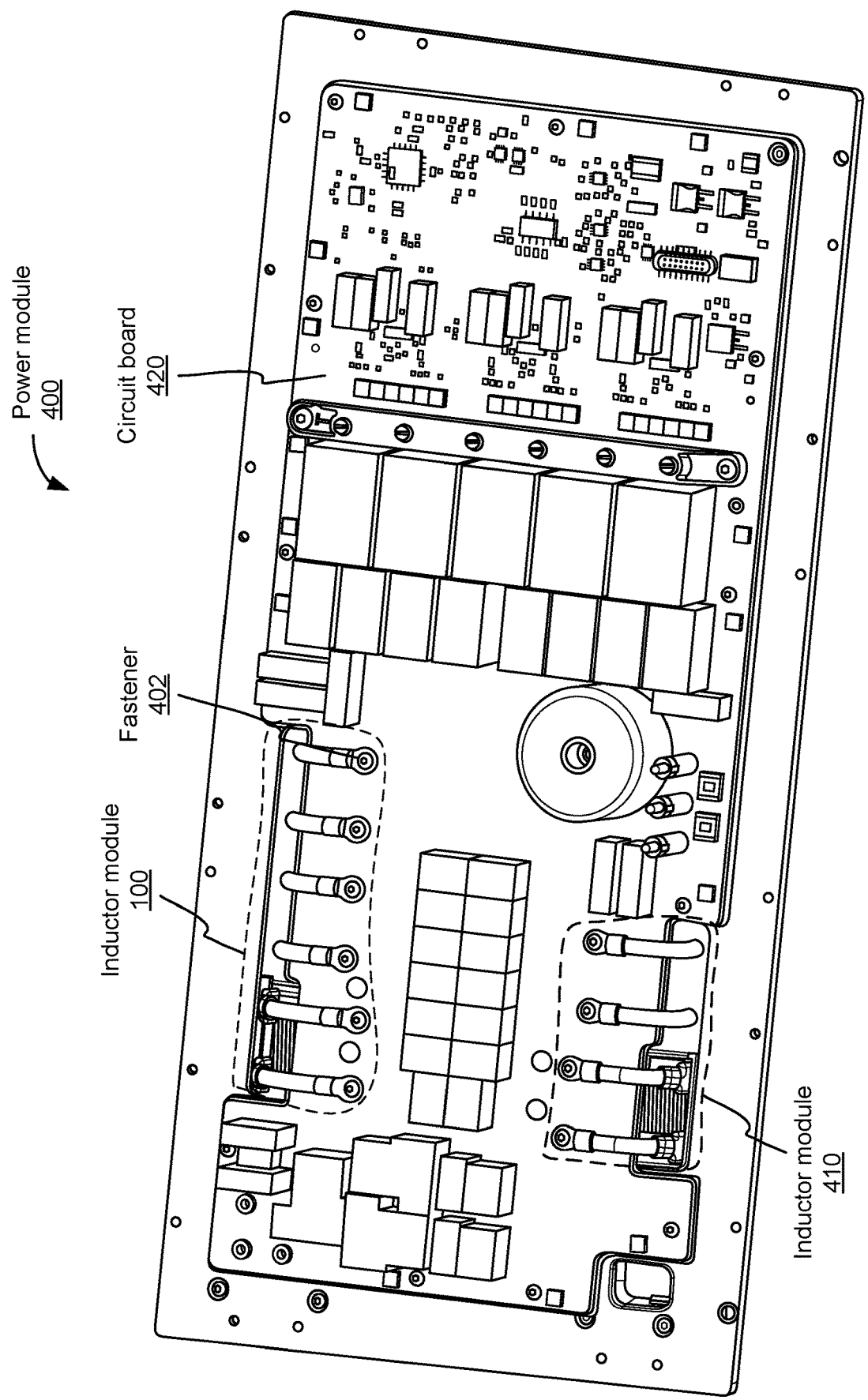
FIG. 4B is a bottom view of an inductor thermal management system within a power module according to an embodiment of the present disclosure.

FIG. 4A is a perspective view of an inductor thermal management system within a power module according to an embodiment of the present disclosure. The power module 400 may be located inside an inverter device that is configured to convert DC (e.g., received from a source such as a battery or solar panels) into AC.

FIG. 4B is a bottom view of an inductor thermal management system within a power module according to an embodiment of the present disclosure. Each of the components are like their counterparts in FIG. 1 unless otherwise described. In this example, the power module 400 includes module 100, module 410, and a circuit board 420. Module 100 and 410 are examples of inductor thermal management systems. As further described herein, fastener 402 may be a double-ended fastener for attaching an inductor to the power module. For example, each inductor has a corresponding pair of flexible cable connectors (e.g., 106 of FIG. 1) secured via respective double-ended fasteners to the power module. The number and placement of electrical components on circuit board 420 are merely exemplary and not intended to be limiting.

Figure 5:
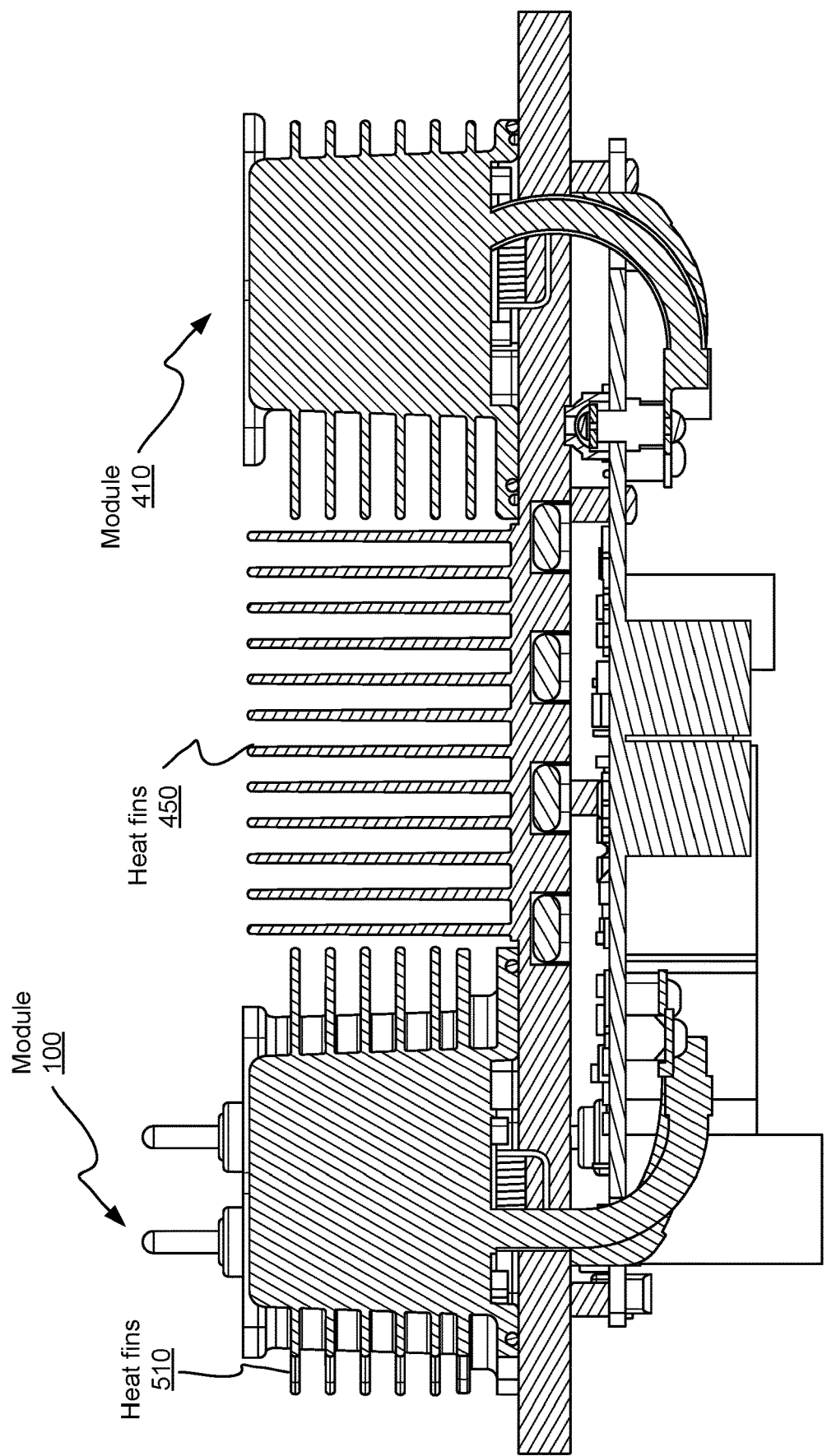
FIG. 5 is a side view of an inductor thermal management system including heat fins according to an embodiment of the present disclosure.

FIG. 5 is a side view of an inductor thermal management system including heat fins according to an embodiment of the present disclosure. The system is primarily cooled through the potting material and heat sink/fins. For simplicity and to more clearly illustrate the fins, some of the components of the system are shown abstracted/as boxes. The module 100 includes the inductor and potting material surrounding the inductor as further described herein.

When the inductor (e.g., core and/or coils) becomes heated, the heat is conducted into the potting material, and then through the potting material to the wall of the housing because the housing has a higher thermal conductivity than the potting material. The heat is then passed through the fins 510, and convection further cools the heat that was introduced to the fins.

The convection may be due to ambient air movement (passive) or fans/other means may actively push air through the area. In various embodiments, the airflow is going into the plane. For thermal conductivity, typically the shorter the path to a point/surface where heat can be dissipated to air, the better the performance. The fins 510 on the module shorten the path and therefore improve heat dissipation. For example, absent fins 510, the path taken to cool the inductor (e.g., 100) would be longer since the closest heat fins would be 450.

The number and placement of cooling fins are merely exemplary and not intended to be limiting. For example, the fins are horizontal here. In alternative embodiments, one or more fins are vertical. Horizontal fins may improve performance. For example, in order for the heat to reach fins 450, the heat travels through a longer path. By providing fins 510, which are substantially horizontal, the average path to the fin surface is shortened, which improves thermal performance.

Figure 6:
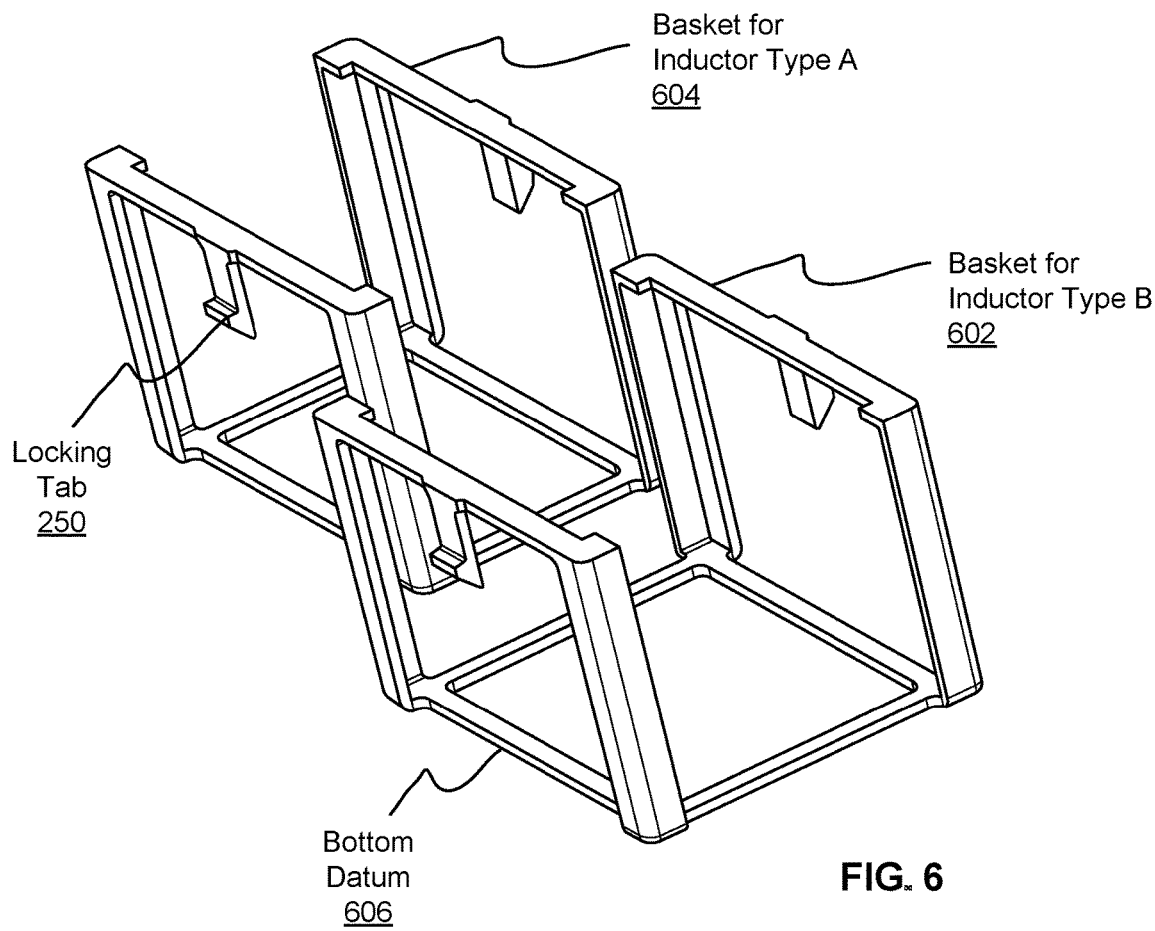
FIG. 6 is a perspective view of baskets for an inductor thermal management system according to an embodiment of the present disclosure.

FIG. 6 is a perspective view of baskets for an inductor thermal management system according to an embodiment of the present disclosure. In various embodiments, the basket performs several functions including being a separator and a retaining mechanism to keep the inductor core in place.

The basket (sometimes called a "nest") provides a frame around the inductor. The frame holds the inductor in place within the cavity. The basket provides a perimeter around the core of the inductor and surrounds enough of it that once the inductor is positioned inside the basket, the movement of the inductor is constrained such that the inductor cannot be mispositioned. The basket ensures that the core of the inductor does not touch the housing and separation is maintained, which helps with cooling because the core (which can become heated) does not touch the housing. Thus, the basket both facilitates installation/positioning of the inductor during manufacturing and prevents unintentional movement once the inductor is installed. In various embodiments, the basket includes a frame without solid sides. Although the inductor may be installed in an inverted position, the basket suspends the inductor in such a way that the inductor will not become displaced from the cavity.

A different basket design may be used for each type of electronic device. For example, in this example, a first basket 604 is for a flat wire inductor (e.g., 120 of FIG. 1) and a second basket 602 is for a primary switching inductor (e.g., 110 of FIG. 1). The basket may be a monolithic piece or may comprise a plurality of pieces. For example, the basket may be implemented as or include a corner or edge protector.

In various embodiments, the basket includes a locking tab 250, which helps retain the inductor core. In various orientations, the inductor may be "upside down," and the potting material is rubbery and may creep over time. Thus, gravity would naturally cause the inductor to fall out if there is no locking mechanism. The basket includes a locking tab that can engage with the housing 240 to prevent the inductor core from falling out. The bottom of the basket lines up to features on the housing. For example, datum 606 datums off the bottom of a respective cavity to ensure alignment and proper positioning within a cavity of the housing. In various embodiments, the top surface is constrained with the variance of the basket to lock the core in.

The basket may be made of any material that is not electrically conductive, does not necessarily have high thermal conductivity, and is tolerant of temperatures to which the module may be heated. For example, the material can be heated to 110 degrees Celsius without substantially degrading. The material is strong enough to retain the inductor core during the manufacturing process, including when the potting material is introduced. That is, when the potting material is introduced, the basket substantially retains its shape and does not become deformed. The basket permits potting material to surround all sides of the inductor. Most of the surface contacting the inductor is therefore potting material, which enhances thermal conduction.

Figure 7:
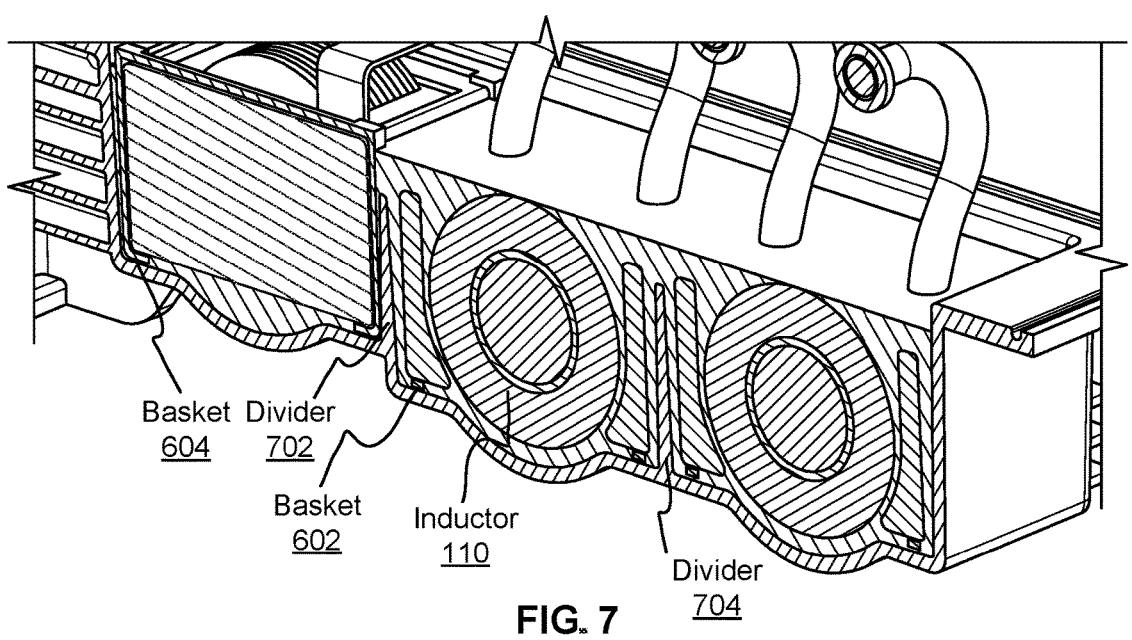
FIG. 7 is a cross-sectional view of an inductor thermal management system including baskets according to an embodiment of the present disclosure.

FIG. 7 is a cross-sectional view of an inductor thermal management system including baskets according to an embodiment of the present disclosure. In various embodiments, the core is pressed together, and there is an adhesive or other means of assembly that holds the wire together in a (tightly wound) bobbin. For the flat wire inductor shown in this example, an adhesive is used to hold the flat wire in position during the manufacturing process. For the primary switching inductor, a cap on tape may be used to keep the coil wound tightly around the bobbin. The bobbin is then placed inside the core, and the core is glued together.

A basket may be installed prior to placing the inductor in the housing and introducing the potting material. In various embodiments, when the inductor is placed inside the housing via the basket, a fixture may be used to hold the wires/leads in a specific position such that the wires come out and naturally end up at a desired location. The inductor and basket assembly is slid into a respective cavity in the housing until the basket tabs lock into the housing.

Referring now to FIG. 2A, when the tab 250 is slipped into a respective receptacle in the housing, the plastic of the tab and frame/arm to which the tab is attached bend as the tab is being inserted. When tab 250 hits the tab receptacle 252, the tab will snap into the place inside the receptacle. The ramp of the tab allows the tab to be pushed into the cavity. Upon reaching the cavity, the tab snaps out (away from the basket and towards the receptacle) to lock into the receptacle. This holds the basket securely in place because a tool is used to bend the tab back (out of the receptacle), and without being bent back, the basket cannot be removed.

Returning to FIG. 7, most of the surfaces of inductors (e.g., 110) that are inset within the housing are flanked by an inner wall of the housing, which means that each inset inductor can transfer heat across multiple surfaces to the surrounding housing. Furthermore, FIG. 7 shows that there are divider features (e.g., 702 and 704) between adjacent inductors. Because each divider feature is also made of metal (e.g., aluminum) like the rest of the housing and also flanks the surfaces of the adjacent inductors, heat from the adjacent inductors can also be transferred into the divider features of the housing.

FIG. 7 shows that a space/gap exists between each surface of an inset inductor and either an inner wall or a divider feature of the housing. A spacer or frame of a basket 602 may help to maintain space between the inductor and the housing. These spaces are intended to maintain electrical isolation between each inductor and the housing. In various embodiments, such spaces are also filled with liquid potting material that is then cured so that the potting material can provide thermal conductance and electrical insulation between the inductors and the housing.

Figure 8:
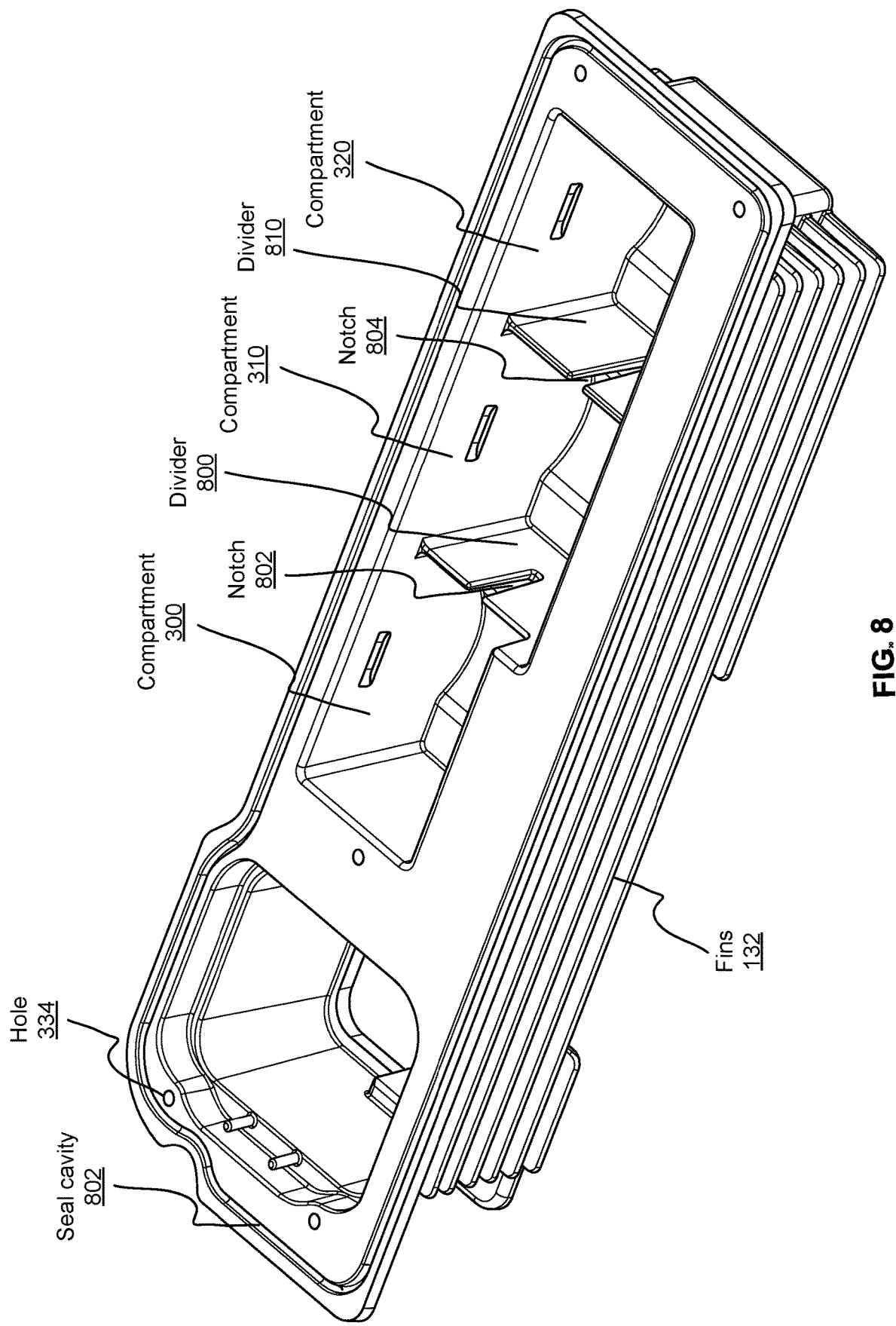
FIG. 8 is a perspective view of a housing for an inductor thermal management system according to an embodiment of the present disclosure.

FIG. 8 is a perspective view of a housing for an inductor thermal management system according to an embodiment of the present disclosure. In this example, the inductors have been omitted to more clearly illustrate the cavities in which the inductors may be placed. Each of the components are like their counterparts in FIGS. 1 and 3 unless otherwise described.

In some embodiments, the housing is made using die-cast aluminum. As shown here, the housing includes contours/cavities that conform to the shapes of the inductors that may be inset into the cavities. The outer surface of the housing includes fins 132 to provide more surface area over which heat can dissipate. In some embodiments, a fan (not shown) in the inverter device can be used to blow air across the fins 132 of the heat sink and the housing to aid in the dissipation of heat.

In various embodiments, a barrier 800 (also referred to as a divider feature) rises up between compartment 300 and compartment 310 to separate adjacent inductors. Similarly, barrier 810 rises up between compartment 310 and compartment 320 to separate adjacent inductors. The barriers 800 and 810 are extensions of the cavities of the housing in between adjacent inset inductors.

The barriers form individual cavities for the baskets/inductors to ride against. For example, a basket (e.g., 604 of FIG. 6) is adapted to fit inside compartment 300, and the barrier is sized and positioned such that as potting material is poured into the mold, the material is allowed to spill over. For example, there is a notch 806 that dips down in divider 800, allowing the potting compound to spill over the barrier into an adjacent cavity. Similarly, there is a notch 804 that dips down in divider 810.

One benefit of this configuration is that it reduces the chances of air pockets or voids. Another benefit is that the barriers help with heat dissipation because the barriers are joined to the outer wall and therefore are additional surfaces that conduct heat way from the inductor. The number and placement of notches are merely exemplary and not intended to be limiting. For example, a shorter notch or plurality of notches or openings may be provided.

Cavity 802 is adapted to receive a seal. In various embodiments, the cavity runs around the perimeter of the module. Another cavity adapted to receive a seal may be provided on the other side of the module (not shown). By installing a seal such as an O-ring in the cavity, an IP seal may be formed to provide ingress protection and EMI protection. In other words, when sealed (e.g., when fasteners are inserted in holes such as hole 334), there is an ingress protected region in which the inductors reside.

In various embodiments, all fasteners (e.g., fasteners that pass through hole 334 and other holes not labeled here) fit inside the ingress protected region. The fasteners hold the module together, and press the seal. For example, the module may be rated to IP67, meaning there is protection against dust over an extended time and protection against short periods of immersion in water while under pressure. The O-rings may be made of a standard material or may be made of an electrically conductive material. One advantage of using an electrically conductive material such as an electrically conductive elastomer is that EMI protection is also provided.

Figure 9:
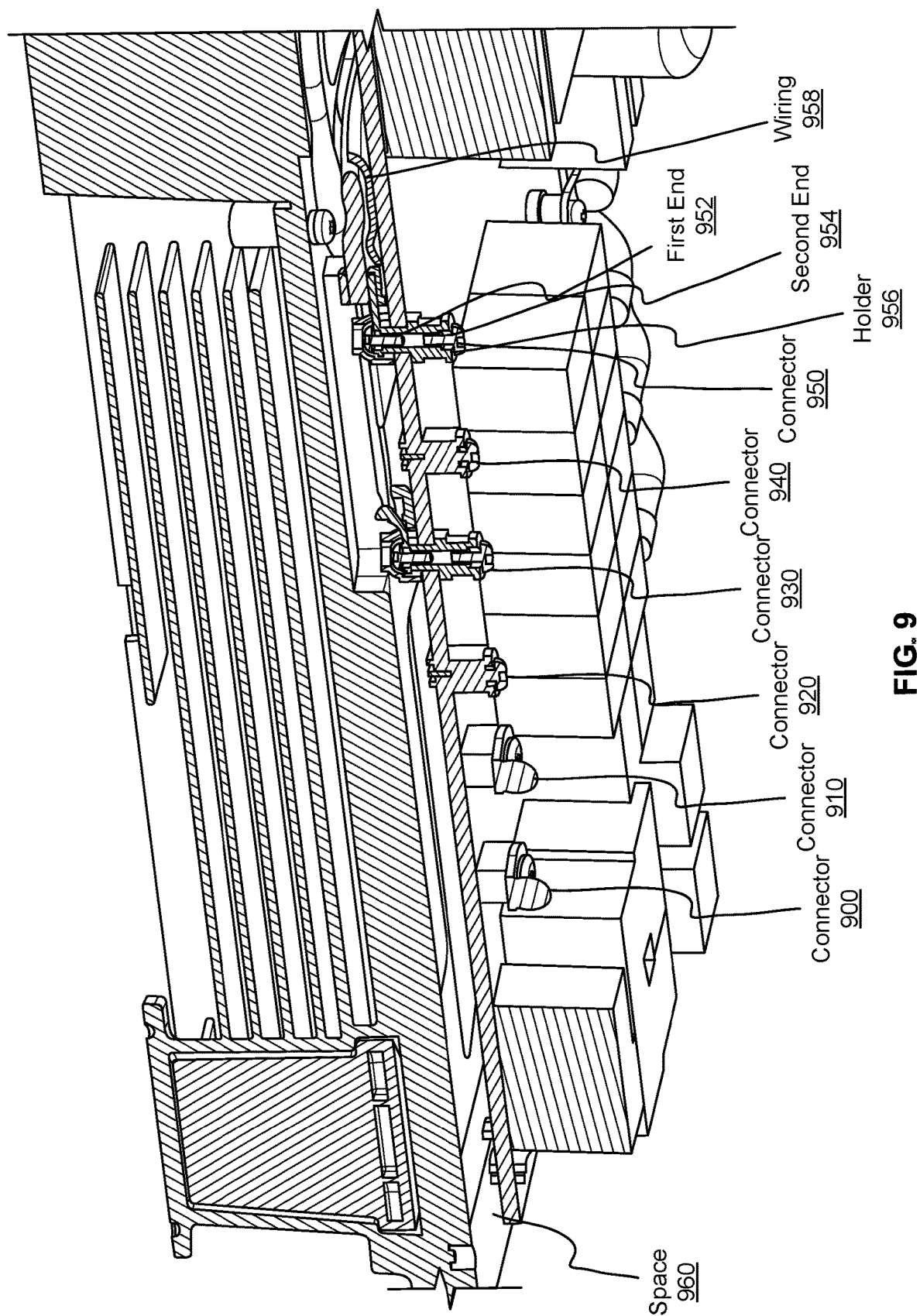
FIG. 9 is a perspective view of an inductor thermal management system including connectors according to an embodiment of the present disclosure.

FIG. 9 is a perspective view of an inductor thermal management system including connectors according to an embodiment of the present disclosure. In various embodiments, space 960 runs substantially across the length of the system (or at least a portion of the system). However, in some regions, the clearance in space 960 may be quite small. Wiring may be run in the space 960 to take AC output from an inverter (not shown) and pass it all the way through the system. The system includes a plurality of connectors 900, 910, 920, 930, 940, and 950. The number and placement of connectors (sometimes referred to as fasteners) is merely exemplary and not intended to be limiting.

Referring to connector 950, the connector is double-ended because it has a first end 952 and a second end 954. The double-ended connector is sometimes referred to as an integrated junction because power can pass through the connector from the first end 952 to the second end 954. The double-sided connector surface mounts to the module and floats inside holder 956. The holder may be made of any suitable material such as plastic.

One of the benefits of the double-sided fastener is that it saves space. For example, conventional connectors such as cable connectors would not fit in space 960. In various embodiments, at least a portion of the double-ended connectors may run directly to a switch (not shown). In this example, connectors 930 and 950 run directly to the switch. This is beneficial because when there is a space constraint, the connectors may be connected to the switch in this manner. For example, the connector may be connected via a Litz wire to the switch in the limited space available.

Wiring (e.g., cable connector 106 of FIG. 1) attaches inductors (e.g., inductor 100 of FIG. 1) that are inset into a cavity, which is joined to a heat sink. The wiring is also attached to a ring terminal (e.g., terminal 102 of FIG. 1), which is fastened to connector 950. In this example, the connector (sometimes referred to as a fastener) is a double-ended screw. Connector 950 is fastened into the heat sink that is located below a circuit board. Because there is a space constraint, the region between the circuit board and the inductors, the double-ended screw can be used as an electrical connection to additional wiring 958 that connects to a switch (not shown).

Given that wiring 106, ring terminal 102, and connector 950 are all thermally conductive, at least some heat that is dissipated by the inductor can be transferred via wiring 106, ring terminal 102, and connector 950 and into the heat sink. Each inductor that is inset in the housing may have one or more wirings that are fastened to the heat sink similar to the technique that is illustrated here.

In various embodiments, (flexible) cable connectors (e.g., cable connector 106) are provided for electrical connections. One benefit of using cable connectors instead of busbars is that the amount of hardware and bill of materials for assembly are reduced. The cable connectors also more easily meet tolerance requirements.

FIG. 10 is a flow diagram illustrating an embodiment of a process for manufacturing an inductor thermal management system. This process may be implemented by a device or system for manufacturing.

In the example shown, the process begins by producing a housing of a heat sink using die-cast, wherein the housing includes at least one cavity (1000). In various embodiments, the housing is produced via die-casting. One advantage of die-casting is that it is the most cost-effective way to produce a housing with features that have many profiles in a third axis as a single piece. Alternatively, the housing may be produced using extrusion, followed by machining.

The process includes machining at least a portion of the housing (1002). Machining portions of the housing is to ensure surfaces are flat. In one aspect, machining the surfaces improves the surface quality to obtain a tight tolerance and also improves heat dissipation if the surface is a thermal surface. Machining ensures surfaces are flat. Holes such as hole 334 are tapped.

Machining provides a tighter tolerance in instances where the as-molded surface does not have a sufficiently tight tolerance. Providing tight tolerance for at least a portion of the (key) datums is performed, which is established by fastener holes 334, 336, and 338. The number and placement of the datums is merely exemplary and not intended to be limiting.

In various embodiments, surfaces that do not need to be machined such as the fins are left as-cast. The fins form a cooling surface. When air passes through the fins/cavity, the area is cooled. The fins serve as a solid to air thermal interface to cool the air.

The process includes positioning a basket within the at least one cavity of the housing (1004). In various embodiments, the basket, or more generally a spacer, may be positioned in the at least one cavity to prevent an object from contacting one or more walls of the cavity.

The process includes providing an inductor within the basket (1006). In various embodiments, the inductor may be provided in the basket prior to positioning the inductor and basket assembly within the at least one cavity of the housing.

The process includes securing the basket to the at least one cavity via a tab of the basket (1008). In various embodiments, the basket includes a tab configured to engage with a receptacle in the at least one wall of the cavity to lock the basket into place. Applying a small amount of pressure guides the locking tab into position in the receptacle so that the basket will not shift out of place.

The process includes introducing a potting material into the housing (1010). The terminals (e.g., 102 and 104 of FIG. 1) are lined up with external components. At this point, the assembly is ready for potting material to be introduced. A potting compound, in liquid form, is poured into the housing. The compound fills the housing due to gravity, and fills up to a certain height. As described with respect to FIG. 8, potting material may flow from one cavity to an adjacent cavity.

The process includes curing the potting material (1012). The potting compound is then allowed to cure and becomes a rubbery material. The potting compound can be allowed to cure at room temperature or the temperature can be elevated to reduce the time it takes to cure.

Following curing, the process optionally includes sealing the assembly and installing fasteners to close and/or secure the assembly to another module such as the power module, an example of which is shown in FIGS. 4A and 4B. For example, a seal is installed in the housing, and the heat sink is attached to a power module using at least one fastener and the seal to provide an area of ingress protection and electromagnetic compatibility.

Although the thermal management system has been described with respect to main power inductors (also called primary switching inductors), this is merely exemplary and not intended to be limiting as the techniques may be applied to provide thermal management for any type of electrical and/or mechanical component that outputs heat with similar properties to the main power inductors. For example, the disclosed techniques effectively dissipate heat in the range of at least 15 to 27 watts.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An inductor thermal management system, comprising:
    an inductor; and
    a heat sink, wherein the heat sink includes:
        a cavity, wherein the cavity is filled with a potting material;
        a basket adapted to hold the inductor in place within the cavity, wherein the basket includes a frame and at least two open sides permitting the potting material to contact a surface exterior to the at least two open sides; and
        a spacer adapted to situate the inductor within the cavity and separate the inductor from at least one wall of the cavity such that heat is transferred from the inductor into the heat sink.

2. The inductor thermal management system of claim 1, wherein the inductor produces at least 12 watts of heat in operation.

3. The inductor thermal management system of claim 1, wherein a core of the inductor does not contact the cavity.

4. The inductor thermal management system of claim 1, wherein a core of the inductor is separated from at least one wall of the cavity.

5. The inductor thermal management system of claim 1, wherein at least one wall of the cavity includes a notch permitting flow over from the cavity to an adjacent area.

6. The inductor thermal management system of claim 1, wherein the spacer prevents a core of the inductor from contacting the at least one wall of the cavity.

7. The inductor thermal management system of claim 1, wherein the spacer is included in the basket.

8. The inductor thermal management system of claim 1, wherein the basket includes a tab configured to engage with a receptacle in the at least one wall of the cavity to lock the basket into place.

9. The inductor thermal management system of claim 1, wherein the potting material is adapted to fill at least a portion of the cavity.

10. The inductor thermal management system of claim 1, wherein:
    the heat sink includes a recess adapted to accept a seal; and
    sealing the heat sink provides ingress protection and electromagnetic compatibility.

11. The inductor thermal management system of claim 1, wherein the heat sink includes a plurality of fins.

12. The inductor thermal management system of claim 1, further comprising another cavity adapted to accept another inductor, wherein the inductor and the other inductor are adjacent to and separated from each other by a divider formed by a shared wall of the cavity and the other cavity.

13. The inductor thermal management system of claim 1, wherein a wiring extending from the inductor is fastened to the heat sink.

14. The inductor thermal management system of claim 1, wherein the inductor includes a coil of Litz wire.

15. The inductor thermal management system of claim 1, wherein the inductor includes a high flux core.

16. The inductor thermal management system of claim 1, wherein the inductor is inset into a metallic shell that is joined to the heat sink.

17. The inductor thermal management system of claim 1, wherein at least a portion of the heat sink is made using die-cast.

* * * * *